(12) United States Patent
Parameswaran et al.

(10) Patent No.: US 8,040,164 B2
(45) Date of Patent: Oct. 18, 2011

(54) CIRCUITS AND METHODS FOR PROGRAMMING INTEGRATED CIRCUIT INPUT AND OUTPUT IMPEDANCES

(75) Inventors: Suresh Parameswaran, Fremont, CA (US); Joseph Tzou, Mountain View, CA (US); Morgan Whately, San Francisco, CA (US); Thinh Tran, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 130 days.

(21) Appl. No.: 12/286,321

(22) Filed: Sep. 29, 2008

(65) Prior Publication Data

US 2009/0085614 A1 Apr. 2, 2009

Related U.S. Application Data (60) Provisional application No. 60/975,668, filed on Sep. 27, 2007.

(51) Int. Cl.
*H03B 1/00* (2006.01)
*H03K 3/00* (2006.01)
(52) U.S. Cl. ........ 327/109; 327/108; 327/110; 327/111; 327/112; 326/30; 326/82; 326/83
(58) Field of Classification Search .......... 327/108–112; 326/30, 82, 83
See application file for complete search history.

(56) References Cited

U.S. PATENT DOCUMENTS

| | | | |
|---|---|---|---|
| 5,917,335 A | 6/1999 | Rees | |
| 6,384,621 B1 | 5/2002 | Gibbs et al. | |
| 6,426,651 B1 | 7/2002 | Mandal et al. | |
| 6,525,558 B2 * | 2/2003 | Kim et al. | 326/30 |
| 6,771,515 B2 | 8/2004 | McCall et al. | |
| 7,034,567 B2 * | 4/2006 | Jang | 326/30 |
| 7,084,662 B1 | 8/2006 | Om et al. | |
| 7,295,033 B2 | 11/2007 | Chung et al. | |
| 7,332,904 B1 | 2/2008 | Menkus et al. | |
| 2004/0000926 A1 | 1/2004 | Ooshita | |
| 2004/0017220 A1 | 1/2004 | To et al. | |
| 2004/0021481 A1 | 2/2004 | Ohno | |
| 2005/0040845 A1 | 2/2005 | Park | |
| 2006/0158213 A1 | 7/2006 | Allan | |
| 2006/0158216 A1 | 7/2006 | Aoyama et al. | |

OTHER PUBLICATIONS

International Written Opinion of International Search Authority, dated Dec. 12, 2008 for International Application No. PCT/US08/11310.
International Search Report of International Searching Authority, dated Dec. 12, 2008 for International Application No. PCT/US08/11310.
U.S. Appl. No. 11/540,831, Vullaganti et al.
U.S. Appl. No. 11/540,996, Vullaganti, Kalyana C.

\* cited by examiner

*Primary Examiner* — Lincoln Donovan
*Assistant Examiner* — John Poos (57) ABSTRACT

An integrated circuit may include at least a first replica driver stage coupled between a reference impedance input and a first power supply node and having a first programmable driver impedance set by a first driver configuration value in the same manner as a first output driver section of the integrated circuit. At least a first replica input termination stage may be coupled between the reference impedance input and the first power supply node and having a first programmable termination impedance set by a first termination configuration value in the same manner as a first input termination section of the integrated circuit. An impedance programming circuit may generate at least the first driver configuration value and the first termination configuration value in response to a potential at the reference node.

16 Claims, 5 Drawing Sheets

| CYCLE | B0 | B1 | B2 | B3 | B4 | B5 | B6 | CMP |
|---|---|---|---|---|---|---|---|---|
| 0 | 0 | 0 | 0 | 0 | 0 | 0 | 0 | 1 |
| 1 | 1 | 0 | 0 | 0 | 0 | 0 | 0 | 1 |
| 2 | 1 | 1 | 0 | 0 | 0 | 0 | 0 | 0 |
| 3 | 1 | 0 | 1 | 0 | 0 | 0 | 0 | 0 |
| 4 | | | | : | | | | : |
| 5 | | | | | | | | |
| 6 | | | | | | | | |
| 7 | 1 | 0 | 0 | 1 | 1 | 0 | 0 | |

CIRCUITS AND METHODS FOR PROGRAMMING INTEGRATED CIRCUIT INPUT AND OUTPUT IMPEDANCES

This application claims the benefit of U.S. Provisional Patent Application Ser. No. 60/975,668 filed on Sep. 27, 2007, the contents of which are incorporated by reference herein.

TECHNICAL FIELD

The present disclosure relates generally to electronic circuits and in particular to impedance programming for inputs and outputs of integrated circuits.

BACKGROUND

Integrated circuits are typically assembled into packages having input and/or output connections, such as pins. Due to the increasing density of integrated circuits and the increasing number of functions that are included into integrated circuits, it may be desirable to ensure functions may be executed with as small a pin count as possible.

Due to the increasing speeds at which data may be transmitted, integrated circuits may include features to address transmission line effects. Due to transmission line effects, in the event of an impedance mismatch between a characteristic impedance of a line and signal source impedance, unwanted signal reflection may occur, leading to high power consumption and/or poor signal integrity.

DETAILED DESCRIPTION

Various embodiments will now be described that show circuits, integrated circuit devices and corresponding methods for programming output and input impedances of an integrated circuit device with a same programming circuit and reference impedance.

Figure 1:
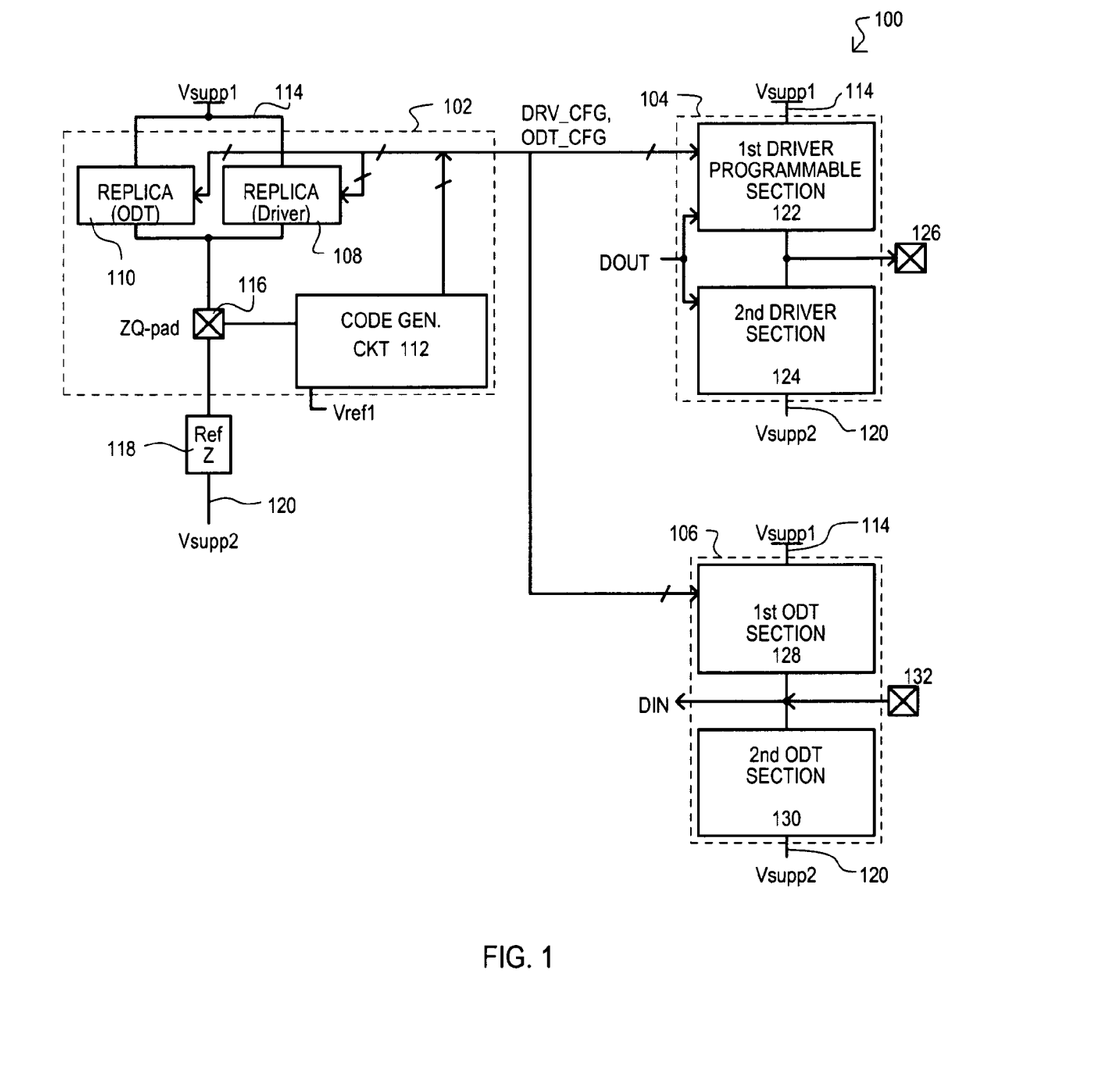
FIG. 1 is a block schematic diagram of an integrated circuit according to a first embodiment.

Referring to FIG. 1, an integrated circuit according to a first embodiment is shown in a block schematic diagram and designated by the general reference character 100. An integrated circuit 100 may include an impedance programming circuit 102, one or more regular output drivers (one shown as 104), and one or more regular input termination circuits (one shown as 106).

An impedance programming circuit 102 may include a first replica driver section 108, a first replica input termination section 110, and a code generation circuit 112. A first replica driver section 108 may be connected between a first power supply node 114 and a reference input 116, and may provide an impedance based on a first driver value DRV_CFG. As will be described in more detail below, a first replica driver section 108 may be a replica of a section within a regular output driver 104. In this way, a first driver value DRV_CFG used to set an impedance of first replica driver section 108 may also be used to establish an impedance in a regular output driver 104.

A first replica input termination section 110 may be connected between first power supply node 114 and reference input 116, and may provide an impedance based on a first input value ODT_CFG. As will be described in more detail below, a first replica input termination section 110 may be a replica of a section within a regular input termination circuit 106. In this way, a first input value ODT_CFG used to set an impedance of first replica input termination section 110 may also be used to establish an impedance in a regular input termination circuit 106.

A code generation circuit 112 may generate first driver value DRV_CFG and first input value ODT_CFG in response to a potential a reference input 116. In the particular embodiment shown, an impedance programming circuit 112 may output values DRV_CFG or ODT_CFG based on a comparison between a voltage at reference input 116 and a reference voltage Vref1.

A reference input 116 may be an external input to integrated circuit 100. A reference impedance 118, external to integrated circuit 100, may be connected between reference input 116 and a second power supply node 120. In one particular embodiment, a reference input 116 may include a bond pad of an integrated circuit (which may be connected to a package input pin when the integrated circuit is assembled into a package). A reference impedance 116 may be a precision resistor.

A regular output driver 104 may include a first regular output section 122 and a second regular output section 124. A first regular output section 122 may be connected between a first power supply node 114 and an output 126 of integrated circuit 100, and may provide an output impedance based on a first driver value DRV_CFG. Thus, once an impedance of first replication driver section 108 is set by value DRV_CFG, the same value may set an impedance of first regular output section 122. A second regular output section 124 may provide an output impedance between output 126 and second power supply node 120. As will be shown by other embodiments herein, a second regular output section 124 may also provide a programmable impedance.

A regular input termination circuit 106 may include a first regular input section 128 and a second regular input section 130. A first regular input section 128 may be connected between a first power supply node 114 and an input 132 of integrated circuit 100, and may provide an input impedance based on a first input value ODT_CFG. Thus, once an impedance of first input termination section 110 is set by value ODT_CFG, the same value may set an impedance of first regular input section 128. A second regular input section 124 may provide an input impedance between input 132 and second power supply node 120, and may also provide a programmable impedance in particular embodiments.

Having described various sections of an integrated circuit 100 according to an embodiment, an impedance programming operation of such an embodiment will now be described.

Initially, first replica input termination section 110 may be disconnected from reference input 116 (e.g., provide an open circuit, or very high impedance). First replica driver section 108 may be enabled to provide an impedance based on DRV_CFG. Code generation circuit 112 may issue an initial value DRV_CFG to establish an initial impedance within first replica driver section 108.

First replica driver section 108 may create a voltage divider with reference impedance 118 to establish a voltage at reference input 116. Code generation circuit 112 may compare the voltage at reference input 116 to reference voltage Vref1. If a sufficient difference exists between such voltages, value DRV_CFG may be adjusted to alter the impedance of first replica driver section 108, and thus bring the voltage at reference input 116 closer to reference voltage Vref1. Such a process is repeated until a value DRV_CFG results in first replica driver section 108 providing the impedance used for the desired voltage at reference input 116. Such a value DRV_CFG may then be stored (in code generation circuit 112, for example).

A first replica driver circuit 108 may then be disconnected from a reference input 116, and first replica input termination section 110 may be enabled to provide an impedance based on ODT_CFG. Code generation circuit 112 may issue an initial value ODT_CFG to establish an initial impedance within first replica input termination circuit 110.

Code generation circuit 112 may operate as described above to arrive at a value ODT_CFG that results in first input termination section 110 providing the impedance used for the desired voltage at reference input 116. Such a value ODT_CFG may then be stored (in code generation circuit 112, for example).

First driver value DRV_CFG may be provided to regular output driver 104 to establish a target impedance in first regular output section 122. In one particular embodiment, such an impedance, in combination with the impedance of second regular output section 124, may provide a desired matching output impedance for a particular application.

Similarly, first input value ODT_CFG may be provided to regular input termination circuit 106 to establish a target impedance in first regular input section 128. In one particular embodiment, such an impedance, in combination with the impedance of second regular input section 130, may provide a desired matching input impedance for a particular application.

In this way, an integrated circuit may provide input and output impedance configuration values for regular output drivers and input termination circuits, using replica circuits connected to a common reference impedance input.

Figure 2:
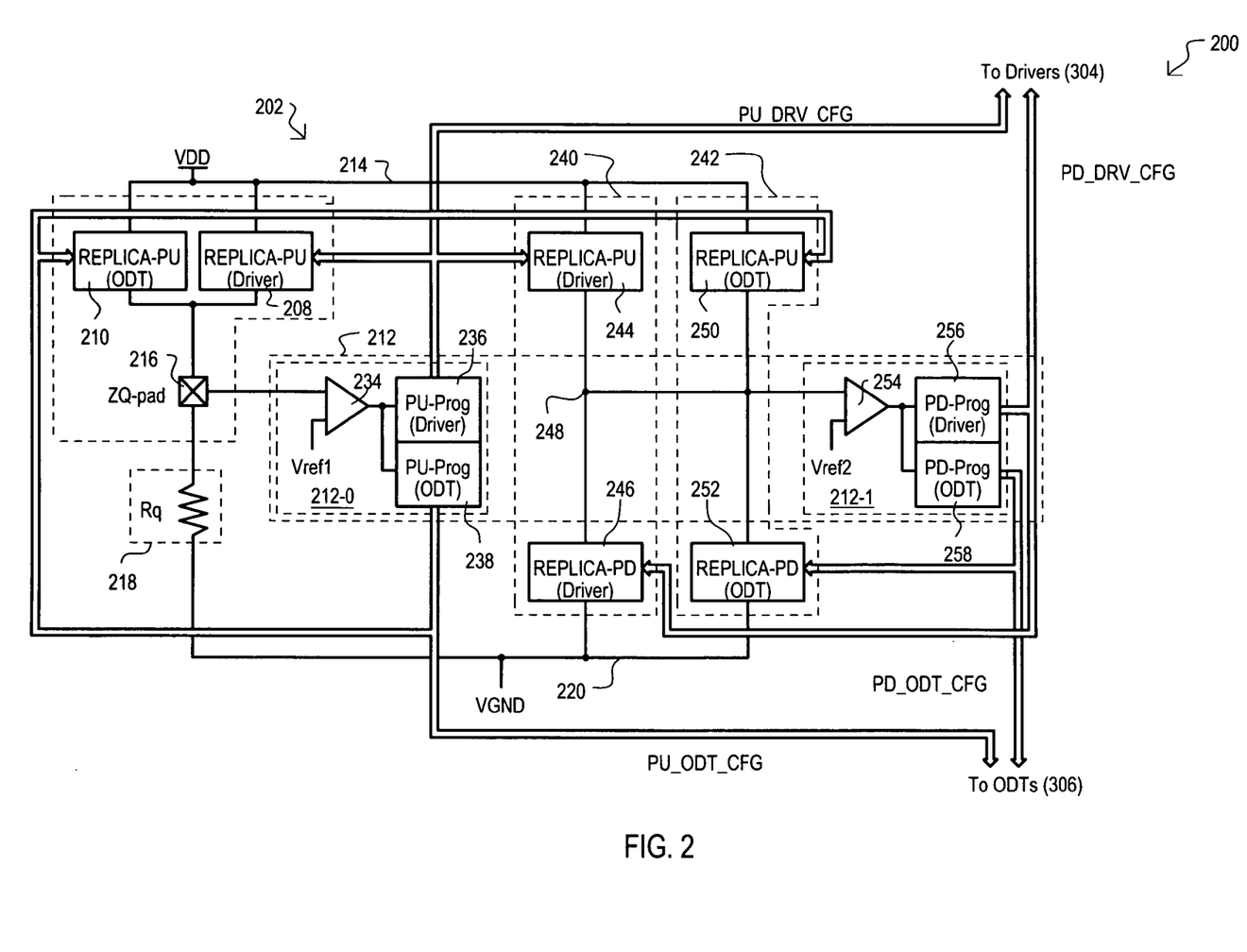
FIG. 2 is a block schematic diagram of an integrated circuit according to another embodiment.

Referring now to FIG. 2, an integrated circuit according to another embodiment is shown in a block schematic diagram, and designated by the general reference character 200. An integrated circuit 200 may include some of the same general circuit sections as FIG. 1, accordingly, like sections are referred to by the same reference character but with the first digit being a "2" instead of a "1". In one very particular arrangement, the embodiment of FIG. 2 may be one version of that shown in FIG. 1.

In the embodiment of FIG. 2, a first power supply node 214 may receive a high power supply voltage VDD, and a second power supply node 220 may receive a low power supply voltage VGND. In addition, a first replica driver section 208 and first replica input termination section 210 may be pull-up (PU) sections (sections that may pull reference input 216 toward a high power supply voltage as their impedance is lowered).

Code generation circuit 212 may include a PU code generation section 212-0 and a pull-down (PD) code generation section 212-1. A PU code generation section 212-0 may generate code value PU_DRV_CFG for establishing an impedance of pull-up sections in replica and regular output drivers, and may also generate a code value PU_ODT_CFG for establishing an impedance of pull-up sections in replica and regular input termination circuits. A PD code generation section 212-1 may generate code value PD_DRV_CFG for establishing an impedance of pull-down sections in replica and regular output drivers, and code value PD_ODT_CFG for establishing an impedance of pull-down sections in replica and regular input termination circuits.

A PU code generation section 212-0 may include a first comparator 234, a PU driver code programmer 236, and a PU input code programmer 238. A first comparator 234 may have one input connected to reference input 216, another input connected to receive a first reference voltage Vref1, and an output connected to PU driver and PU input code programmers (236 and 238). PU driver code programmer 236 may alter a code value PU_DRV_CFG based on an output of first comparator 234 and eventually store a code value PU_DRV_CFG that results in a voltage at reference input 216 matching Vref1. In the same fashion as PU driver code programmer 236, PU input code programmer 238 may alter a code value PU_ODT_CFG based on an output of first comparator 234 and then store a code value PU_ODT_CFG that results in a voltage at reference input 216 matching Vref1.

In very particular embodiments, each of PU driver code programmer 236 and PU input code programmer 238 can be counter-latch combinations, like that shown in FIG. 10.

An integrated circuit 200 may further include a replica driver circuit 240 and replica input termination circuit 242. A replica driver circuit 240 may have a same structure as existing output drivers (not shown) on integrated circuit 200, and in the particular example of FIG. 2, may include a second replica driver section 244 and a third replica driver section 246. A second replica driver section 244 may be connected between first power supply node 214 and a calibration node 248. Second replica driver section 244 may be a pull-up section having the same structure as first replica driver section 208, and may receive code value PU_DRV_CFG. Third replica driver section 246 may be connected between calibration node 248 and a second power supply node 220. Third replica driver section 246 may be a pull-down section that provides an impedance based on a driver pull-down code PD_DRV_CFG.

A replica input termination circuit 242 may have a same structure as existing input termination circuits (not shown) on integrated circuit 200, and in the particular example of FIG. 2, may include a second replica input termination section 250 and third replica input termination section 252. A second replica input termination section 250 may be connected between first power supply node 214 and a calibration node 248, and may be a pull-up section having the same structure as first replica input termination section 210 and may receive a same code value PU_ODT_CFG. Third replica input termination section 252 may be connected between calibration node 248 and a second power supply node 220, and may be a pull-down section that provides an impedance based on an input pull-down code PD_ODT_CFG.

Just as PU code generation section 212-0 may generate code values PU_DRV_CFG and PU_ODT_CFG for pull-up sections (208, 210, 244 and 250), a PD code generation section 212-1 may generate code values PD_DRV_CFG and PD_ODT_CFG for pull-down sections 246 and 252, respectively. A PU code generation section 212-1 may include a second comparator 254, a PD driver code programmer 256, and a PD input code programmer 258. A PD code generator 212-1 may operate in the same general fashion as PU code generation section. However, when generating code value PD_DRV_CFG, a voltage divider at calibration node 248 may be created by second replica driver section 244 (as programmed by code value PU_DRV_CFG) and third replica driver section 246 (as programmed by PD_DRV_CFG). Likewise, when generating code value PD_ODT_CFG, a voltage divider at calibration node 248 may be created by second replica input termination section 250 (as programmed by code value PU_ODT_CFG) and third replica input termination section 252 (as programmed by PD_ODT_CFG). It is noted that in particular arrangements, reference voltage Vref2 received by second comparator 254 may be the same as reference voltage Vref1 received by first comparator 234.

In very particular embodiments, each of PD driver code programmer 256 and PD input code programmer 258 can be counter-latch combinations, like that shown in FIG. 10.

An impedance programming operation for integrated circuit 200 will now be described.

PU code generation section 212-0 may generate a code value PU_DRV_CFG based on a comparison between a voltage at reference node 216 and reference voltage Vref1. Such a code value PU_DRV_CFG may then be applied to set an impedance of second replica driver section 244. PD code generation section 212-1 may then generate a code value PD_DRV_CFG based on an impedance provided at calibration node 248 and reference voltage Vref2 (which may be the same as Vref1). In this way, driver code values PU_DRV_CFG and PD_DRV_CFG may be generated using one reference impedance 218.

In addition, PU code generation section 212-0 may generate a code value PU_ODT_CFG based on a comparison between the voltage at reference node 216 and reference voltage Vref1. Such a code value PU_ODT_CFG may then be applied to set an impedance of second replica input termination section 250. PD code generation section 212-1 may then generate a code value PD_ODT_CFG based on a comparison between a voltage at calibration node 248 and reference voltage Vref2. In this way, driver code values PU_ODT_CFG and PD_ODT_CFG may be generated using a same one reference impedance 218 used to generate driver code values PU_DRV_CFG and PD_DRV_CFG.

Driver code values (PU_DRV_CFG and PD_DRV_CFG) may be applied to output drivers (not shown) to establish a matching impedance for such drivers, for example. Similarly, input code values (PU_ODT_CFG and PD_ODT_CFG) may be provided to inputs (not shown) to establish a matching input termination impedances (on die termination, ODT) for such inputs, for example.

Figure 3:
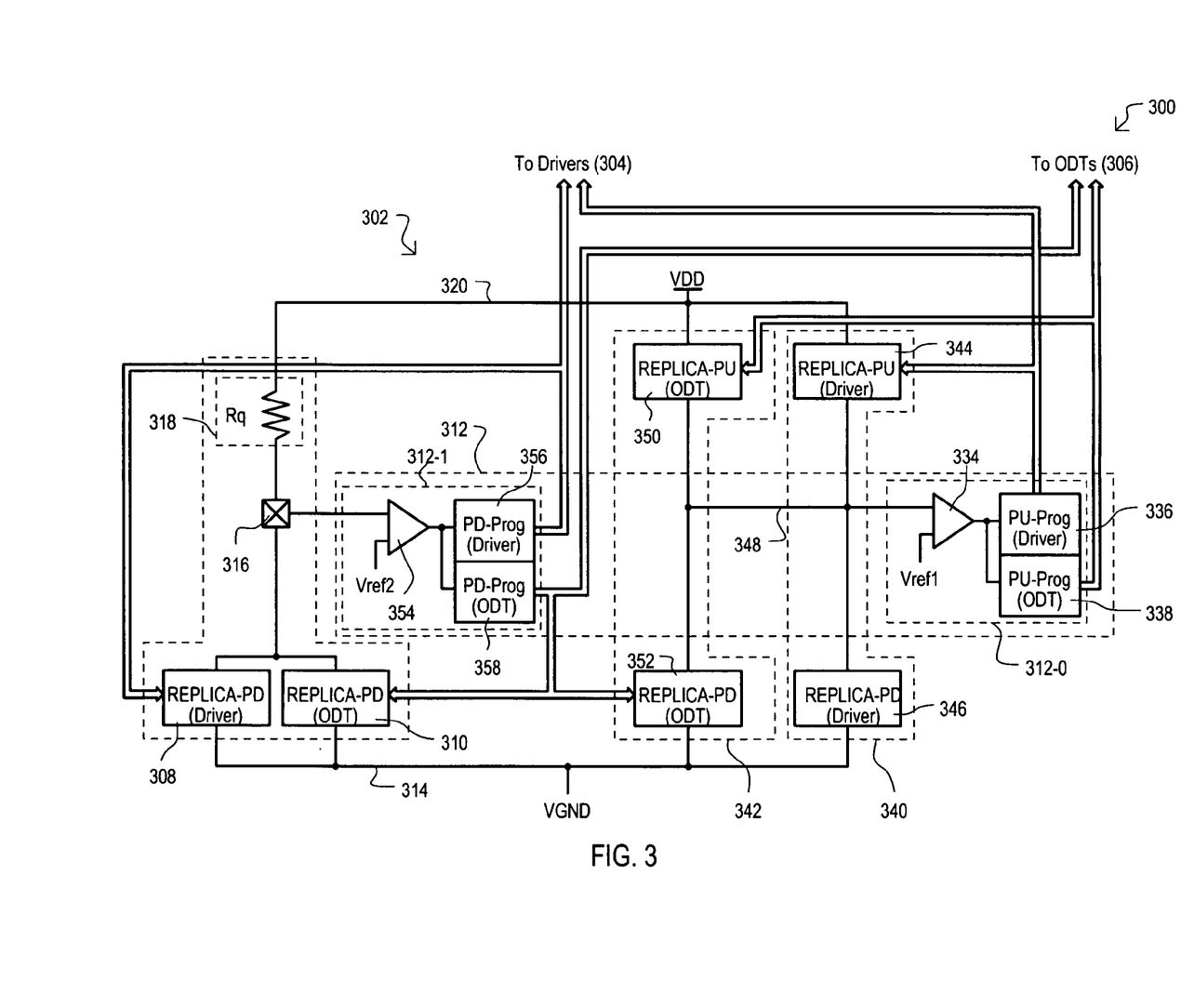
FIG. 3 is a block schematic diagram of an integrated circuit according to a further embodiment.

Referring now to FIG. 3, an integrated circuit according to a further embodiment is shown in a block schematic diagram, and designated by the general reference character 300. An integrated circuit 300 may include some of the same general circuit sections as FIG. 2, accordingly, like sections are referred to by the same reference character but with the first digit being a "3" instead of a "2". In one very particular arrangement, the embodiment of FIG. 3 may be one version of that shown in FIG. 1.

The embodiment of FIG. 3 may differ from that of FIG. 2, that a reference impedance 318 may be connected between a reference input 316 and a high power supply node 320, rather than a low power supply. Consequently, a PD code generation section 212-1 may first generate pull-down codes (PD_DRV_CFG and PD_ODT_CFG). Such codes may then establish an impedance for (pull-down) third replica driver section 346 and third replica input termination section 348. This may enable the generation of pull-up codes (PU_DRV_CFG and PU_ODT_CFG) by PU code generation section 212-0.

Figure 4:
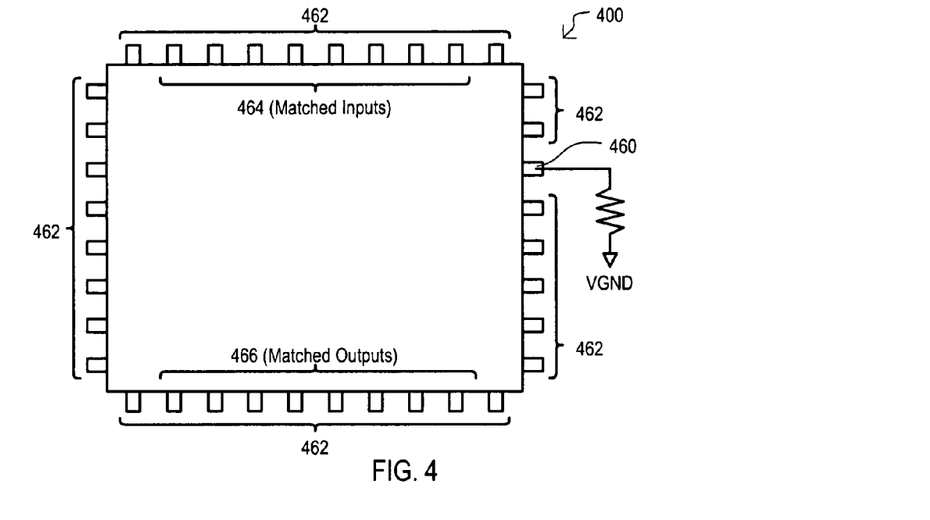
FIG. 4 is a top plan view of an integrated circuit device according to another embodiment.

Referring now to FIG. 4, an integrated circuit device according to yet another embodiment is shown in top plan view and designated by the general reference character 400. In one very particular arrangement, the embodiment of FIG. 4 may be one version of any of those shown in FIGS. 1-3.

Integrated circuit device 400 may be a "packaged" integrated circuit having external connections. In the embodiment shown, integrated circuit device includes one reference impedance connection 460. All other package connections 462 may not be a reference impedance connection 460. In addition, one or more of connections 462 may be impedance matched input connections 464, having an input termination impedance generated according to any of the impedance programming circuits or method shown herein, or equivalents. Further, one or more of connections 462 may be impedance matched output connections 466, having an output impedance generated according to any of the impedance programming circuits or method shown herein, or equivalents.

It is understood that the particular package arrangement of FIG. 4 should not be construed as limiting. Alternate embodiments may have other package forms with different type connections, such as a leadless chip carrier, pin grid array, ball grid array or land grid array, to name but a few of the many possible variations.

In this way, a packaged integrated circuit device may have programmable impedance matched inputs and outputs with only one input connection dedicated to a reference impedance.

Figure 5:
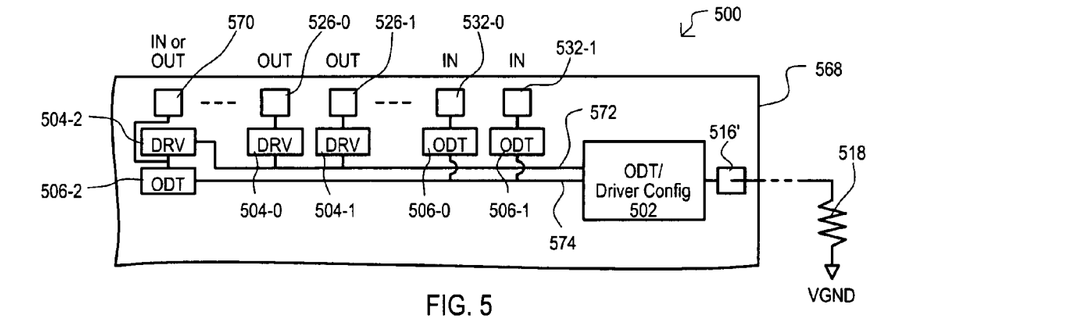
FIG. 5 is a top plan view of an integrated circuit according to yet another embodiment.

Referring to FIG. 5, an integrated circuit according to a further embodiment is shown in a top plan view and designated by the reference character 500. An integrated circuit 500 may include some of the same general circuit sections as FIG. 1, accordingly, like sections are referred to by the same reference character but with the first digit being a "5" instead of a "1". In one very particular arrangement, the embodiment of FIG. 5 may be one version of any of those shown in FIGS. 1-3.

An integrated circuit 500 may include a die 568 in which may be formed an impedance programming circuit 502 according to any of the embodiments shown herein or equivalents. Impedance programming circuit 502 may have a reference input that includes a bond pad 516'. A reference impedance 518 may be connected to such a bond pad 516' via package connections.

FIG. 5 also shows regular output drivers 504-0 and 504-1 connected to IC outputs 526-0 and 526-1 and input termination circuits 506-0 and 506-1 connected to IC inputs 532-0 and 532-1. IC outputs (526-0 and 526-1) and IC inputs (532-0 and 532-1) may include bond pads. The particular embodiment of FIG. 5 also shows an input/output (I/O) pad 570 which may be configured as either an input or an output connection to IC 500. A regular output driver 504-2 and regular input termination circuit 506-2 may be connected to I/O pad 570.

Driver impedance setting codes (e.g., PU_DRV_CFG, PD_DRV_CFG) generated by impedance programming circuit 502 may be provided to regular output drivers (504-0 to 504-2) on a driver code bus 572, to thereby set an output impedance for such output drivers. Similarly, input impedance setting codes (e.g., PU_ODT_CFG, PD_ODT_CFG) generated by impedance programming circuit 502 may be provided to regular input termination circuits (506-0 to 506-2) on a termination code bus 574 to set an input impedance for inputs.

Figure 6A:
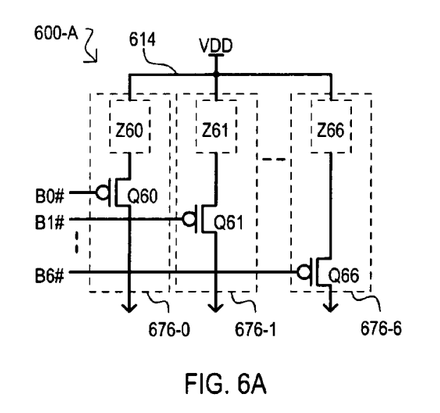
FIGS. 6A and 6B are schematic diagrams of programmable impedance circuits that may be included in the embodiments.
Figure 6B:
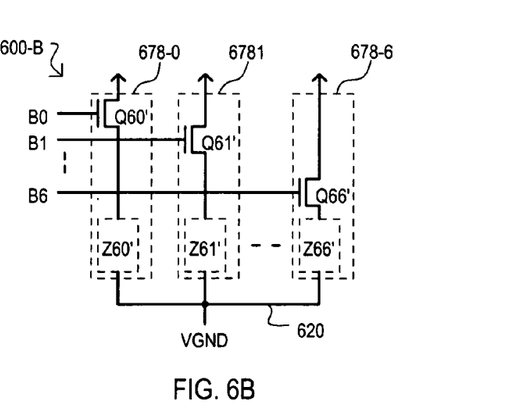

Referring to FIGS. 6A and 6B, two very particular examples of programmable impedance circuits are shown in schematic diagrams.

FIG. 6A shows a pull-up programmable impedance path 600-A, which may be one particular version of any of replica driver sections 108, 208, 244, 344 or any of input termination circuits 110, 210, 250, 350. A pull-up programmable impedance path 600-A may include a number of impedance paths 676-0 to 676-6 connected in parallel to a high power supply node 614. Each impedance path (676-0 to 676-6) may include a switch device Q60 to Q66 which may be enabled in response to a corresponding code bit B0# to B6#. In the particular embodiment shown, switch devices (Q60 to Q66) may be p-channel MOS type transistors. Optionally, each impedance path (676-0 to 676-6) may include an impedance element Z60 to Z66.

FIG. 6B shows a pull-down programmable impedance path 600-B, which may be one particular version of any of replica driver sections 108, 246, 308, 346 or any of input termination circuits 110, 252, 310, 352. Like pull-up programmable impedance path 600-A, pull-down programmable impedance path 600-B may include impedance paths 678-0 to 678-6 connected in parallel to a low supply node 620. Each impedance path (678-0 to 678-6) may include a switch device Q60' to Q66' which may be enabled in response to a corresponding code bit B0 to B6. In the particular embodiment shown, switch devices (Q60' to Q66') may be n-channel MOS type transistors. Optionally, each impedance path (678-0 to 678-6) may include an impedance element Z60' to Z66'.

While the above embodiments have shown arrangements that include one integrated circuit, alternate embodiments may include multiple integrated circuits with reference inputs that may share an external reference impedance. Two particular examples of such arrangements are shown in FIGS. 7A and 7B.

Figure 7A:
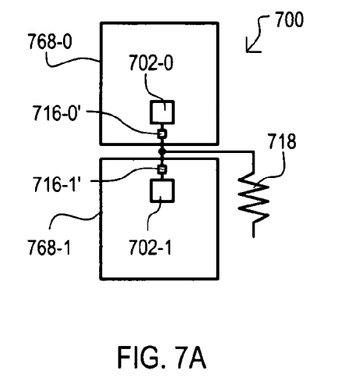
FIGS. 7A and 7B are diagrams showing integrated circuit devices according to embodiments.

Referring to FIG. 7A, an integrated circuit device 700 is shown in a plan view, and may include a first die 768-0 and second die 768-1, each having a corresponding impedance programming circuit 702-0 and 702-1 and reference input pads 716-0' and 716-1'. Reference input pads (716-0' and 716-1') may be commonly connected to a reference impedance 718.

Figure 7B:
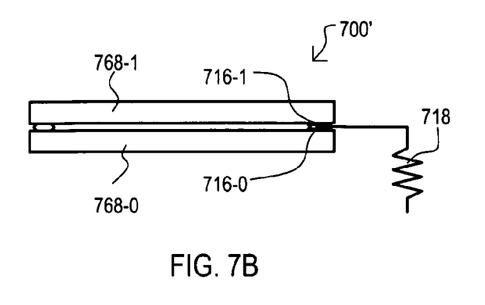

Referring to FIG. 7B, an integrated circuit device 700' is shown in a side cross sectional view, and may include the same items as FIG. 7A. FIG. 7B shows an integrated circuit device 700' in which first die 768-0 and second die 768-1 may be stacked on top of one another.

In this way, an integrated circuit device may include multiple integrated circuits having commonly connected reference impedance inputs.

While embodiment may include circuits, integrated circuits, and integrated circuit devices, alternate embodiments may include methods of programming impedances within integrated circuits.

Figure 8:
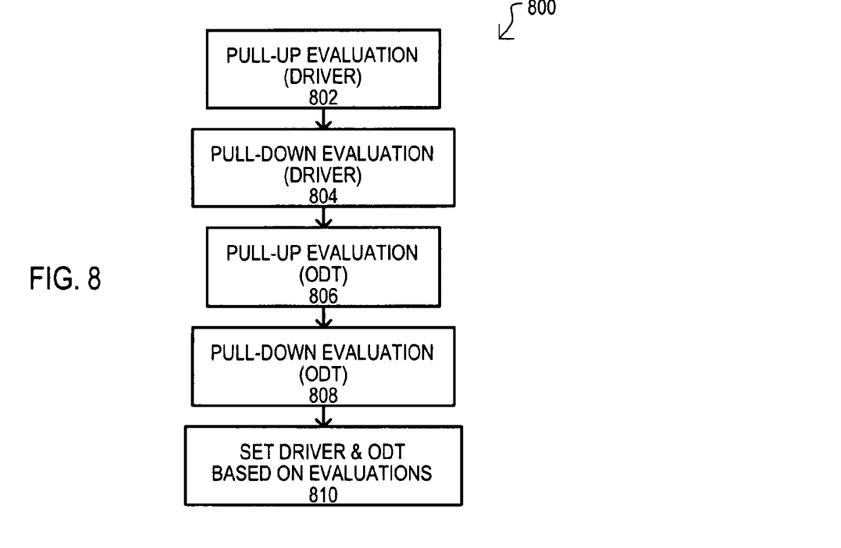
FIG. 8 is a diagram showing a method according to an embodiment.

Referring to FIG. 8, a method according to first embodiment is shown in flow diagram and designated by the general reference character 800. A method 800 may include an evaluation of a driver pull-up (box 802). This may include establishing a value to program driver pull-up sections based on a reference impedance. A method 800 may further include an evaluation of a driver pull-down (box 804). This may include establishing a value to program driver pull-down sections based on a previously programmed driver pull-up section.

Referring still to FIG. 8, a method 800 may also include an evaluation of an input (e.g., on die termination) pull-up (box 806). This may include establishing a value to program input pull-up sections based on the same reference impedance noted with respect to box 802. A method 800 may further include an evaluation of an input pull-down (box 808). This may include establishing a value to program input pull-down sections based on a previously programmed input pull-up section.

Once evaluations for drivers and input have been performed, impedances of regular drivers and inputs may be set based on such evaluations (box 810).

In this way, impedances may be programmed for both inputs and outputs of an integrated circuit.

Figure 9:
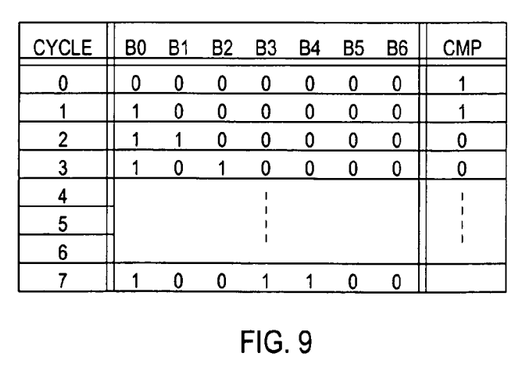
FIG. 9 is a diagram showing the generation of a multi-bit impedance control code that may be executed by embodiments.

Referring to FIG. 9, one very particular method of generating a multi-bit impedance controlling code is shown in diagram. Such a method may be executed by any of code generation circuits 112, 212 or 312.

FIG. 9 shows cycles of operations (CYCLE) and corresponding bits. Bits B0 to B6 provide a weighted response in a resulting programmable impedance of a driver or input termination section, with bit B0 having the most significance and B6 having the least significance.

A comparator output (CMP) may vary according to whether a voltage resulting from a binary code is greater than or less than a reference voltage.

During each cycle, a next least significant bit may be set based on a comparator output, until all seven bits are set.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the embodiments of impedance programming of the output driver and on-die termination and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit comprising:
   at least a first replica driver stage coupled between a reference impedance input and a first power supply node and having a first programmable driver impedance set by a first driver configuration value in a same manner as a first output driver section of the integrated circuit;
   at least a first replica input termination stage coupled between the reference impedance input and the first power supply node and having a first programmable termination impedance set by a first termination configuration value in a same manner as a first input termination section of the integrated circuit; and
   code generation circuit that generates at least the first driver configuration value and the first termination configuration value in response to a potential at a reference node.

2. The integrated circuit of claim 1, wherein:
   the first power supply node is a high power supply node;
   the at least first replica driver stage comprises a replica pull-up driver stage that drives the reference impedance input towards a high power supply voltage in response to the first driver configuration value; and
   the at least first replica input termination stage comprises a replica pull-up input termination stage, and the first programmable termination impedance is set in the same manner as a pull-up input impedance section between the high power supply node and an input of the integrated circuit.

3. The integrated circuit of claim 1, wherein:
   the first power supply node is a low power supply node;
   the at least first replica driver stage comprises a replica pull-down driver stage that drives the reference impedance input towards a low power supply voltage in response to the first driver configuration value; and
   the at least first replica input termination stage comprises a replica pull-down input termination stage, and the first programmable termination impedance is set in the same manner as a pull-down input impedance section between the low power supply node and an input of the integrated circuit.

4. The integrated circuit of claim 1, further including:
   at least a second replica driver stage coupled between a calibration node and the first power supply node and having a second programmable driver impedance set by the first driver configuration value;
   at least a third replica driver stage coupled between the calibration node and the second power supply node and having a third programmable driver impedance set by a third driver configuration value in the same manner as a second output driver section of the integrated circuit; and
   the code generation circuit generates the third driver configuration value in response to a potential at the calibration node.

5. The integrated circuit of claim 1, wherein:
   at least a second replica input termination stage coupled between a calibration node and the first power supply node and having a second programmable termination impedance set by the first termination configuration value;
   at least a third replica input termination stage coupled between the calibration node and the second power supply node and having a third programmable termination impedance set by a third termination configuration value in the same manner as a second input termination section of the integrated circuit; and
   the code generation circuit generates the third termination configuration value in response to a potential at the calibration node.

6. The integrated circuit of claim 1, wherein the code generation circuit comprises:
   at least a first comparator having a first input coupled to the reference impedance input, a second input coupled to receive a reference voltage, and a first comparator output; and
   at least a first counter latch circuit that alters a count value based on a state of the first comparator output to provide at least the first driver configuration value and the first termination configuration value.

7. The integrated circuit of claim 1, further including:
   at least a second replica driver stage coupled between a calibration node and the first power supply node and having a second programmable driver impedance set by the first driver configuration value;
   at least a third replica driver stage coupled between the calibration node and the second power supply node and having a third programmable driver impedance set by a third driver configuration value in the same manner as a second output driver section of the integrated circuit; and
   the code generation circuit further includes:
   at least a second comparator having a first input coupled to the calibration node, a second input coupled to receive the reference voltage, and a second comparator output, and
   at least a second counter latch circuit that alters a count value based on a state of the second comparator output to provide at least the second driver configuration value and the third driver configuration value.

8. A method of calibrating output driver impedance and input impedance of an integrated circuit, comprising:
   calibrating a first replica driver section, coupled between a first power supply node and a reference input, to a first predetermined driver impedance based on a reference impedance coupled between the reference input and a second power supply node;
   calibrating a first replica input termination section, coupled between the first power supply node and the reference input, to a first predetermined input impedance based on the reference impedance; and
   setting a first output driver impedance coupled to an output node of the integrated circuit in response to first driver configuration values that calibrate the first replica driver section, and setting a first input node termination impedance coupled to an input node of the integrated circuit in response to first termination configuration values that calibrate the first replica input termination section.

9. The method of claim 8, further including:
   setting an impedance of a second replica driver section, coupled between the first power supply node and a calibration node, in response to the first driver configuration values; and
   calibrating a third replica driver section, coupled between the calibration node and a second power supply node, to a third predetermined driver impedance based on the impedance of the second replica driver section.

10. The method of claim 8, further including:
    setting an impedance of a second replica input termination section, coupled between the first power supply node and a calibration node, in response to the first termination configuration values; and calibrating a third replica input termination section, coupled between the calibration node and a second power supply node, to a third predetermined termination impedance based on the impedance of the second replica input termination section.

11. The method of claim 8, wherein:

the first power supply node is a high power supply node;

the first replica driver section comprises a replica driver pull-up section;

the first replica input termination section comprises a replica pull-up input termination section;

the first output driver impedance comprises a driver section that drives the output node toward the high power supply node; and the first input node termination impedance is an on die input termination section coupled between the input node and the high power supply node.

12. The method of claim 8, wherein:

calibrating the first replica driver section includes generating a multi-bit first binary code based on a comparison between a voltage at the reference impedance and a reference voltage.

13. The method of claim 12, further including:

setting an impedance of a second replica driver section, coupled between the first power supply node and a calibration node, in response to the first driver configuration values; and calibrating a third replica driver section, coupled between the calibration node and a second power supply node, to a third predetermined driver impedance based on the impedance of the second replica driver section, the calibrating of the third replica driver section including generating a second multi-bit binary code based on a comparison between a voltage at the calibration node the reference voltage.

14. The method of claim 12, wherein:

generating the multi-bit first binary code includes activating different impedance elements of the first replica driver section in response to different bits of the multi-bit first binary code.

15. A method of calibrating output driver impedance and input impedance of an integrated circuit, comprising:

calibrating a first replica driver section, coupled between a first power supply node and a reference input, to a first predetermined driver impedance based on a reference impedance coupled between the reference input and a second power supply node;

calibrating a first replica input termination section, coupled between the first power supply node and the reference input, to a first predetermined input impedance based on the reference impedance; and setting a first output driver impedance coupled to an output node of the integrated circuit in response to first driver configuration values that calibrate the first replica driver section, and setting a first input node termination impedance coupled to an input node of the integrated circuit in response to first termination configuration values that calibrate the first replica input termination section, wherein calibrating the first replica driver section includes generating a multi-bit first binary code based on a comparison between a voltage at the reference impedance and a reference voltage.

16. The method of claim 15, further including:

setting an impedance of a second replica driver section, coupled between the first power supply node and a calibration node, in response to the first driver configuration values; and calibrating a third replica driver section, coupled between the calibration node and a second power supply node, to a third predetermined driver impedance based on the impedance of the second replica driver section, the calibrating of the third replica driver section including generating a second multi-bit binary code based on a comparison between a voltage at the calibration node the reference voltage.

* * * * *